(12) United States Patent
Hurley et al.

(10) Patent No.: US 7,347,354 B2
(45) Date of Patent: Mar. 25, 2008

(54) METALLIC SOLDER THERMAL INTERFACE MATERIAL LAYER AND APPLICATION OF THE SAME

(75) Inventors: Edward Hurley, Chandler, AZ (US); Chris Rumer, Chandler, AZ (US); Rod Christner, Chandler, AZ (US); Tim Renfro, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 10/806,118

(22) Filed: Mar. 23, 2004

(65) Prior Publication Data
US 2005/0211752 A1 Sep. 29, 2005

(51) Int. Cl.
*B23K 31/02* (2006.01)
(52) U.S. Cl. ............. 228/219; 228/221; 228/245
(58) Field of Classification Search ........... 228/245, 228/249, 254, 218, 221; 438/121, 122
See application file for complete search history.

(56) References Cited

U.S. PATENT DOCUMENTS

| | | | | |
|---|---|---|---|---|
| 3,593,412 A * | 7/1971 | Foote | ............. | 228/123.1 |
| 4,979,664 A * | 12/1990 | Lyons et al. | ......... | 228/180.21 |
| 5,082,162 A * | 1/1992 | Kamiyama et al. | ...... | 228/123.1 |
| 5,388,755 A * | 2/1995 | Baxter | ............. | 228/123.1 |
| 5,394,426 A * | 2/1995 | Joslin | ............. | 372/50.12 |
| 5,523,260 A * | 6/1996 | Missele | ............. | 156/330 |
| 5,767,577 A * | 6/1998 | Nihei et al. | ......... | 257/707 |
| 5,901,901 A * | 5/1999 | Schneegans et al. | ...... | 228/254 |
| 5,931,222 A * | 8/1999 | Toy et al. | ............. | 165/80.3 |
| 5,972,736 A * | 10/1999 | Malladi et al. | ............. | 438/118 |
| 6,451,155 B1 * | 9/2002 | Toy et al. | ............. | 156/325 |
| 6,653,741 B2 * | 11/2003 | Sreeram et al. | ............. | 257/781 |
| 6,658,034 B2 * | 12/2003 | Garnache et al. | ...... | 372/45.013 |
| 6,735,230 B1 * | 5/2004 | Tanabe et al. | ......... | 372/43.01 |
| 7,187,083 B2 * | 3/2007 | Lewis et al. | ............. | 257/772 |
| 2002/0079355 A1 * | 6/2002 | Totino et al. | ............. | 228/245 |
| 2002/0092896 A1 * | 7/2002 | Makino et al. | ............. | 228/245 |
| 2003/0058620 A1 | 3/2003 | Rumer et al. | ............. | 361/705 |
| 2003/0077478 A1 | 4/2003 | Dani et al. | ............. | 428/673 |
| 2003/0128521 A1 | 7/2003 | Matayabas, Jr. et al. | .... | 361/705 |
| 2003/0134454 A1 | 7/2003 | Houle | ............. | 438/122 |
| 2003/0155409 A1 * | 8/2003 | Dockus et al. | ............. | 228/245 |
| 2003/0155640 A1 | 8/2003 | Yan et al. | ............. | 257/690 |
| 2003/0178720 A1 | 9/2003 | Rumer et al. | ............. | 257/715 |
| 2003/0178730 A1 | 9/2003 | Rumer et al. | ............. | 257/778 |
| 2003/0218058 A1 * | 11/2003 | Shaw et al. | ............. | 228/230 |
| 2003/0222126 A1 * | 12/2003 | Morozumi et al. | ......... | 228/219 |

(Continued)

OTHER PUBLICATIONS

Mizuishi et al., Fluxless and Substantially Voidless Soldering for Semiconductor Chips, IEEE 38th Components Conference Proceedings, May 1988, pp. 330-334.*

*Primary Examiner*—Kiley Stoner
(74) *Attorney, Agent, or Firm*—KED & Associates, LLP (57) ABSTRACT

A method of bonding a thermal interface layer to a heat dissipating member and the resulting device are described. The method may involve plating a bonding surface of the heat dissipating member, and bonding a metallic solder onto the plating under vacuum or inert conditions and substantially without the use of a solder flux. Also described, is a heat dissipating device having a thermal interface material layer bonded thereto for thermal coupling to a heat conducting component by an impermanent attachment.

25 Claims, 5 Drawing Sheets

U.S. PATENT DOCUMENTS

| | | | |
|---|---|---|---|
| 2004/0017656 A1 | 1/2004 | Lee et al. | 361/687 |
| 2004/0035911 A1* | 2/2004 | Dockus et al. | 228/56.3 |
| 2004/0036521 A1 | 2/2004 | Kanaparthy et al. | 327/333 |
| 2004/0200879 A1* | 10/2004 | Lewis et al. | 228/56.3 |
| 2005/0116387 A1* | 6/2005 | Davison et al. | 264/293 |
| 2005/0218508 A1* | 10/2005 | Fitzgerald et al. | 257/720 |

* cited by examiner

METALLIC SOLDER THERMAL INTERFACE MATERIAL LAYER AND APPLICATION OF THE SAME

FIELD

Embodiments of the present invention may relate to semiconductor manufacturing technology generally, and more particularly, to application of a thermal interface material to a heat dissipation component in a semiconductor assembly.

BACKGROUND

The reliability, durability, and functional integrity of electrical components can be inversely related to the operating temperatures experienced in such devices, whether the heat is generated by the device itself or from other sources. Semiconductor technology can be characterized as a quest to place more electronic components in less space to achieve greater speed and performance. As integrated circuits and other semiconductor devices become faster, operating frequencies (e.g., clock speed in a microprocessor) also increase. At the same time, the distances between the conductive lines within the semiconductor device are reduced due to efforts to construct semiconductor devices that are increasingly compact.

As the density of conductive lines and the clock speed of circuits increase, the amount of heat generated by the device also increases. Therefore, it is critical to have an efficient heat-removal system associated with integrated circuits. One method to remove heat from an electronic assembly or an integrated semiconductor package assembly is to place a heat dissipating device made of heat-conducting material in thermal communication with a heat-generating component (or another heat dissipating device) to draw heat away from a heat-sensitive electronic component. For instance, a heat spreader to absorb heat from a heat generating device can be used in combination with a second level solution, such as a heat sink, a heat pipe, or a fan/heat sink device.

Thermal conductivity between proximate surfaces is related to the surface area that is in actual contact. Because surfaces of heat dissipating devices and electrical components are not completely smooth, at least on a microscopic level, it is difficult, if not impossible, to achieve perfect contact between their surfaces. Because air is a poor thermal conductor, air pockets that may remain between the surfaces can inhibit the conduction of heat from one surface to another. To overcome the effects of air as a thermal insulator, and to conduct heat from a device that generates heat, such as a chip die, to a heat dissipating device (or from one heat dissipating device to another), thermal interface material (TIM) has been developed to fill the gaps between the proximate surfaces. Semiconductor chip packages can use a primary TIM layer (TIM1) to thermally couple a die and a heat spreader, and/or a secondary TIM layer (TIM2) to thermally couple the heat spreader and a heat sink.

The TIM technologies used for electronic packages encompass several classes of materials such as phase change materials, epoxies, greases, and gels. However, such materials have only a moderate thermal conductivity and thus provide an inadequate level of heat removal or redistribution for many applications, such as high performance, high power processors. Other limitations of such TIM layers include the uncontrolled flow of the TIM when heated at operating temperatures, for example, into a bleed hole of a heat spreader. In addition, such TIM layers adhere to the surfaces of the components after disassembly, which requires cleanup in a testing environment, and reapplication after performing maintenance on a finished product. Furthermore, application of such TIM layers applied at the point of final assembly of an integrated semiconductor package is particularly undesirable when the die and the heat dissipating device are fabricated at remote locations.

Use of a metallic solder as the TIM layer can result in improved thermal conductivity. However, metallic TIM layers and processes for their application to the component surfaces have many drawbacks, including some of the aforementioned limitations. For example, achieving a durable intermetallic bond in the soldering process may require the reflow of the TIM, which may include heating a solid TIM preform located between two components. Heating at temperatures that potentially damage heat sensitive components may be required, however, and components having sufficiently different coefficients of thermal expansion may produce an unreliable intermetallic bond. Another impediment to achieving a reliable bond in the soldering process is that metal surfaces of the components are readily subject to oxidation. Accordingly, a chemical solder flux may be used in the soldering process. Use of a solder flux in soldering the TIM layer may result in permanent bonding of surfaces of each of the coupled components. A permanent attachment at both surfaces, however, makes subsequent disassembly of a final product difficult, and may be even more undesirable when using a TIM layer to thermally couple a heat dissipating device and a test vehicle.

BRIEF DESCRIPTION OF THE DRAWINGS

The foregoing and a better understanding of the present invention will become apparent from the following detailed description of arrangements and example embodiments (and the claims) when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

In the following detailed description, like reference numerals and characters may be used to designate identical, corresponding, or similar components in differing figure drawings. Further, in the detailed description to follow, example sizes, models, values, ranges, and the like may be given although the present invention is not limited to the same. Where specific details are set forth in order to describe example embodiments of the invention, it should be apparent to one skilled in the art that the invention may be practiced without these specific details.

Embodiments of the present invention may provide a method of forming a thermal interface material (TIM) layer on a heat dissipating member or device. The method may involve permanently attaching a metallic solder TIM layer to a bonding surface of the heat dissipating member, for example, by an intermetallic or an intermolecular bond. Soldering of the TIM layer to the heat dissipating member may be accomplished without the use of a solder flux. As bonded to the heat dissipating device, the TIM layer may then be used to thermally couple the heat dissipating device and a heat conducting component (e.g., of an electronic assembly). The thermal coupling may be achieved by a temporary or impermanent attachment.

The heat dissipating member may be a heat transferring or conducting device such as a primary or a secondary heat removal system, e.g., heat spreader, heat sink, and heat sink/fan combination. The electronic assembly may be any electronic assembly, for example, an electronic package or a semiconductor chip package. The assembly component may be a heat conducting component, such as a chip die (integrated circuit) or other heat generating device, as well as a heat dissipating device, such as a primary or a secondary heat removal system, e.g., heat spreader, heat sink, and heat sink/fan combination. Thus, the TIM layer may thermally couple a heat spreader and a die (TIM1 layer), a heat spreader and a heat sink (TIM2 layer), as well as other components.

The TIM layer may form a permanent attachment or bond to the bonding surface to which it is soldered. The bond may be an intermetallic or an intermolecular bond that is durable throughout a wide temperature range, including an operating temperature of a heat conducting component to which it may thermally couple. Additionally, because solder flux is substantially or entirely absent from the TIM, the thermal coupling provided by the TIM layer to an assembly component may be an impermanent or releasable attachment that is achieved at a temperature above an ambient or room temperature, for example, at or above a phase change temperature of the TIM. Accordingly, separation of the TIM layer from the heat conducting component may be achieved at a temperature below an operating temperature of the assembly component, for instance, by detaching the heat dissipating device from the assembly component.

Thus, an embodiment of the present invention may be useful in performance testing (e.g., research & development, and quality control) of an electronic assembly, in which a heat dissipating device is typically serially used to thermally couple multiple test vehicles. In addition, an embodiment of the present invention may be useful in maintenance or repair of a finished product that involves separation of the heat dissipating device from an assembly component(s) to which it may thermally couple. Accordingly, an embodiment of the present invention may include a heat dissipating device having a TIM layer provided thereon for thermal coupling of a test vehicle, and an embodiment of the present invention may include a heat dissipating device having a TIM layer provided thereon for thermal coupling in a finished product.

Various arrangements and embodiments of the present invention will now be described with respect to the respective figures.

A method of attaching or bonding the metallic solder TIM layer according to an embodiment of the present invention may include preparing a bonding surface of a heat dissipating member. Preparation of the bonding surface may include plating the bonding surface with at least one wetting layer, and may further include providing one or more additional wetting layers over the first wetting layer. The method may include placing a metallic solder and the heat dissipating member into a vacuum chamber. The vacuum chamber may be placed under vacuum conditions. An (first) inert environment may be provided in the vacuum chamber. At least a portion of the inert environment may be removed from the vacuum chamber. The vacuum chamber may be placed under heat conditions. An (second) inert environment may be provided in the vacuum chamber. The second inert environment may be a pressurized or an unpressurized environment. The metallic solder may be heated to a temperature of equal to or greater than the melting point of the metallic solder to form a liquid metallic solder. The liquid metallic solder may be disposed on at least a portion of the bonding surface to form a liquid metallic solder layer. At least a portion of the inert environment may be removed from the vacuum chamber. The liquid metallic solder layer may cool to a temperature of less than the melting point of the metallic solder.

The heat dissipating member or device may be a heat sink, a heat pipe, and/or any other heat conducting device. The heat dissipating device may be made from any thermally conductive material, including, but not limited to, metals, such as copper, aluminum, and/or alloys thereof. According to an embodiment of the present invention, the heat dissipating device may have a surface area of from about 10 to about 100 $mm^2$, and preferably from about 30 to about 40 $mm^2$. Other surface areas are possible.

The bonding surface of the heat dissipating device may be all or any portion of one or more surfaces of the heat dissipating device. The bonding surface may have any shape, regular and/or irregular, and may be larger or smaller than the area of the applied TIM layer. The bonding surface of the heat dissipating device may be substantially flat and/or adapted to interface with a surface of the heat generating device or another heat dissipating device. The bonding surface may be smooth or rough, and/or have a complementing texture with a surface of the heat generating device or another heat dissipating device.

Figure 3:
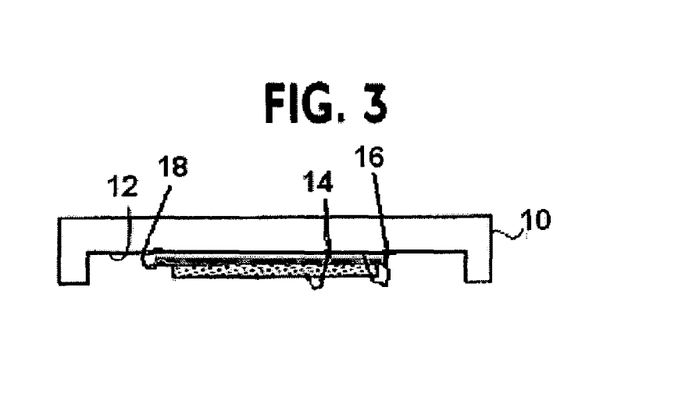
FIG. 3 is a cross-sectional side view of a heat dissipating device according to an example embodiment of the present invention.
Figure 4:
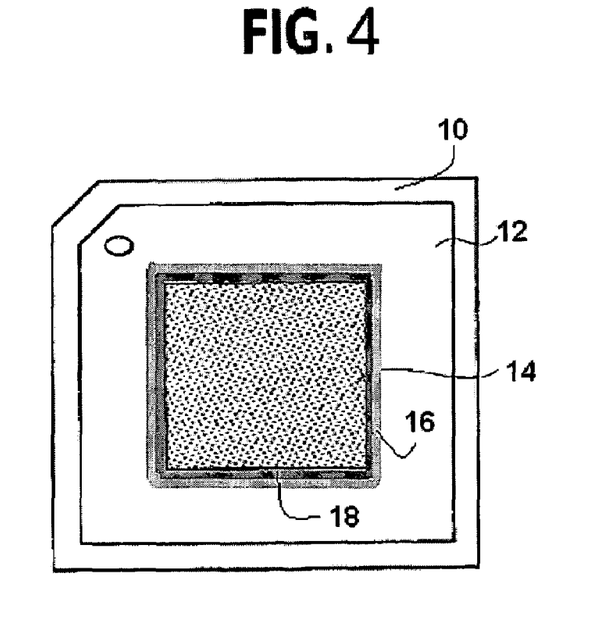
FIG. 4 is a bottom view of the heat dissipating device shown in FIG. 3.
Figure 7:
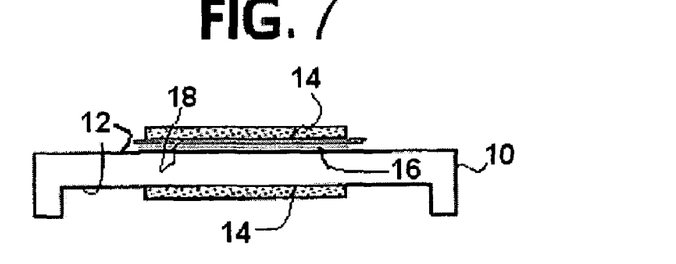
FIG. 7 is a cross-sectional side view of a heat dissipating device according to an example embodiment of the present invention.
Figure 8:
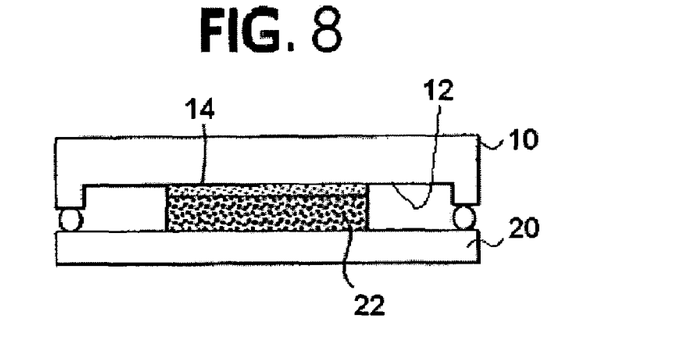
FIG. 8 is a cross-sectional side view of a package assembly according to an example embodiment of the present invention.

Preparing the bonding surface for receiving the TIM layer may include at least partially removing an oxidation layer from the bonding surface, for example, by chemically and/or mechanically cleaning the bonding surface. Removal of the oxidation layer may be by any suitable method. Preparing the bonding surface may include machining the appropriate surfaces. As shown in block 302 of FIG. 10, preparing the bonding surface may include plating at least a portion of the bonding surface with a wetting layer. FIGS. 3, 4, and 7 show a first wetting layer 16 located on a portion of the bonding surface 12 of the integrated heat spreader (IHS) 10.

Figure 10:
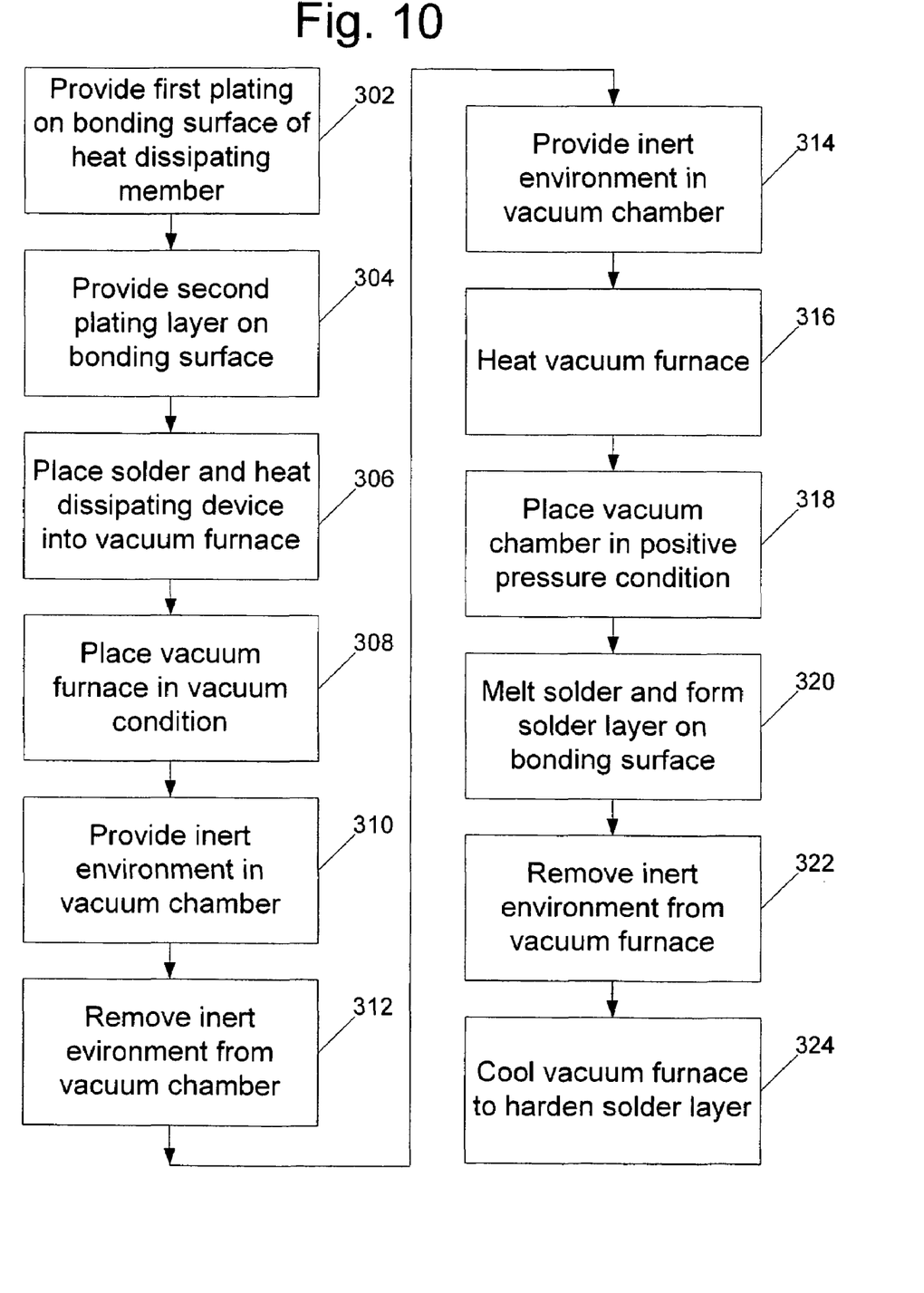
FIG. 10 is a flowchart showing operations according to an example embodiment of the present invention.

Plating of the bonding surface may improve wettability. A known plating method may be used to plate the bonding surface, such as electrolytic plating. The wetting layer may be any suitable substance such as gold (Au) or Nickel (Ni). According to an embodiment of the present invention, a first wetting layer containing Ni plating may be formed or provided on at least a portion of the bonding surface, and a second wetting layer containing Au plating, for example, may be formed or provided on at least a portion of the Ni plating. For example, electrolytic plating with Ni, and/or plating with flash Au on the Ni plating. Other plating materials are possible. Block 304, of FIG. 10, shows application of second plating over at least a portion of the initial wetting layer. FIGS. 3, 4, and 7 show a second wetting layer 18 located on or over the first wetting layer 16. Although not specifically shown in FIGS. 3, 4, and 7, the first wetting layer may be used without the second wetting layer 18, as well as in conjunction with additional wetting layers. The bonding surface may be prepared for receiving the metallic solder before and/or after placement of the heat dissipating device into the vacuum furnace.

According to an embodiment of the present invention, the TIM layer may be a thermally conductive solder material, such as In, In/Sn, In/Ag, Sn/Ag/Cu, Sn/Bi, In/Sn/Bi and In/Zn, Sn/Ag and Sn/In/Ag or other low melting temperature alloy or compound. The TIM layer may be HiFlux HF-60120, for example, which is commercially available from TherMax Korea Corp. The TIM layer may be a fluxless solder or a solder that does not require use in conjunction with a chemical flux or other fusing or wetting agent to form a bond. The TIM layer may be an active solder that does require use in conjunction with a surface deoxidizing agent to form a bond.

The TIM layer may include a low melting temperature solder, for example, having a melting point temperature of 200° C. or less, for instance, about 170° C., or 150° C. or less. Other melting point temperatures are possible. The TIM layer may include a low melting temperature solder alloy or compound having two or more melting point temperatures. The TIM layer may include a eutectic material. According to an embodiment of the present invention, the TIM layer may include a metallic solder having a melting point that is equal to or greater than the maximum operating temperature of the component to which it is to thermally couple. The metallic solder may be malleable or deformable at temperatures within the range of operating temperatures of the thermally coupled component, thus undergoing controlled deformation when functioning as a heat transfer medium, to occupy spatial voids and gaps in coupling with the component by an impermanent attachment. The metallic solder may have a phase change temperature that is within the range of operating temperatures of the thermally coupled component. The TIM layer may contain little or substantially no solder flux, or no solder flux at all. For example, chemical flux may be present in the TIM in an insufficient amount to form a permanent bond with the thermally coupled component.

Placing the metallic solder and the heat dissipating member into a vacuum furnace, as shown, for example, in block 306 of FIG. 10, may include placement of metallic solder in the form of one or more solid pieces or preforms of solder material in a vacuum chamber. The preform may have the dimensions, for example, of a rectangle or a square, for instance, of about 2.5 inches by about 2.5 inches, and a thickness of about 0.1 inch or less. Other shapes, forms, and dimensions are possible, such as films, foils, and sheets. More than one preform may be used, for example, a multi-layered stack. The metallic solder may be positioned on or over the heat dissipating device, for example, such that gravity may facilitate reflow of the metallic solder over the desired portion of the bonding surface. The vacuum chamber may be a kiln, retort, vacuum furnace, or other suitable container for heating of metals under vacuum and/or pressurized conditions, or having both positive and negative pressure environments.

Placing the vacuum chamber under vacuum conditions, as shown, for example, in block 308 of FIG. 10, may include removing or evacuating all or at least a portion of an initial or starting atmosphere from the vacuum chamber. A vacuum may be drawn in the vacuum chamber to remove an amount of oxygen gas from the vacuum chamber. For example, a sufficient amount of oxygen gas may be removed from the vacuum chamber to prevent or at least inhibit oxidation of the surfaces of the heat dissipating member and/or metallic solder. A vacuum may be pulled in the vacuum chamber to negative pressures of less than about 750 torr, for example, about 1 mtorr or less to about 100 torr or more, or about 10 to about 100 mtorr. Other vacuum conditions are possible.

An (first) inert environment may be provided in the vacuum chamber, as shown, for example, in block 310 of FIG. 10. The vacuum furnace may be purged or placed in inert conditions (e.g., substantially void of oxygen gas), for example, by backfilling the vacuum furnace with an inert gas such as nitrogen ($N_2$) or Argon. The vacuum furnace may be backfilled under vacuum conditions, for example, to a vacuum environment of from about 1 mtorr or less to about 500 torr or more, for example, 50 mtorr to about 1 torr. Other environments are possible.

All or any portion of the inert environment may be removed from the vacuum chamber. A vacuum may be achieved in the vacuum chamber to negative pressures of less than about 750 torr, for example, about 1 mtorr or less to about 100 torr or more, or about 10 to about 100 mtorr. Other vacuum conditions are possible.

The operations shown in blocks 308 and 310 of FIG. 10 may be repeated once (e.g., blocks 312 and 314), twice, or more (not shown) as desired. The vacuum chamber may be purged as many times as desired, and may include, for example, placing the vacuum chamber under heat condition, for example, as shown in block 316 of FIG. 10. Heating of the vacuum chamber environment may be sufficient to cause outgassing of components (e.g., the heat dissipating device) in the vacuum chamber. The vacuum chamber may be evacuated after outgassing occurs.

Heating the metallic solder may be to a temperature equal to or greater than the melting point of the metallic solder (i.e., heated to a temperature at which it undergoes a solid to liquid transition) to form a liquid or flowable metallic solder. Heating a metallic solder compound may be to a temperature equal to or greater than the melting point of one or more, or all of the metallic solder alloys. Heating the metallic solder may include heating the vacuum furnace. The vacuum furnace may be heated to a temperature of from about 10 to about 300° C., which may be held constant or varied throughout the heating. Other temperatures are possible. The vacuum furnace may be heated to a temperature sufficient to reflow the metallic solder. Heating temperatures of the vacuum furnace may be below a temperature at which oxidation of the metals therein occurs. Heating times may be of from about 10 minutes to about 12 hours. Heating the metallic solder may also or instead be by heating the metallic solder, for example, directly or indirectly with a heating device or element. The heating device may have a heating surface with which the heated metallic solder may contact without attachment, such as a graphite heating plate.

An (second) inert environment may be provided in the vacuum chamber, for example, by backfilling the vacuum furnace with an inert gas such as nitrogen ($N_2$) or Argon. The vacuum furnace may be backfilled to a positive pressured inert environment, for example, as shown in block 318 of FIG. 10. The inert environment may be present in the vacuum chamber in an amount, for example, of from about 0 (zero) to about 100 p.s.i. or more, for instance, from about 15 to about 40 p.s.i. Other negative and positive pressures are possible. The inert environment may be maintained in the vacuum chamber as a constant pressure or varied over time.

Pressure may be applied directly to the metallic solder, for example, by applying a force to the heat dissipating device through gravity by placing an object(s) on top of or over the heat dissipating device, and/or use of a clamping device or the like, for instance, to compress the heat dissipating device against the metallic solder.

Subjecting the heat dissipating device and the metallic solder to temperatures, heating times, and pressure may be controlled substantially as described above to melt the metallic solder to form a liquid metallic solder, for example, as shown in block 320 of FIG. 10.

The liquid metallic solder may be disposed on at least a portion of the bonding surface to form a softened or liquid metallic solder layer, for example, as shown in block 320 of FIG. 10. The metallic solder in liquid form may be deposited on the bonding surface of the heat dissipating device by any known method of depositing a liquid onto a surface so that it adheres to the surface. For example, the heat dissipating member may be placed over or on top of the metallic solder preform which rests on or over the surface of the heating plate. The heated liquid may then spread over a portion of the bonding surface of the heat dissipating member, as the distance between the heat dissipating member and the heating plated is decreased or allowed to decrease, for example, by gravity. Disposing the TIM layer on the bonding surface may include dispensing the liquid metallic solder onto the bonding surface or screen printing.

All or any portion of the second inert environment may be removed or evacuated from the vacuum furnace, for example, as shown in block 322 of FIG. 10. The environment may be removed gradually, for instance, by a slow leak or predetermined bleed rate, or abruptly, for instance, by substantially opening the exhaust valve. For example, the environment may be reduced to a pressure of from about 25 to about 15 p.s.i.

The liquid metallic solder layer may be cooled or allowed to cool to a temperature of less than the melting point of the metallic solder, for example, as shown in block 324 of FIG. 10, i.e., to solidify or cure into a solid TIM layer. The liquid metallic solder layer may be cooled or allowed to cool to a temperature of less than the phase change temperature of the metallic solder. The deposited liquid metallic solder layer may cool to a sufficiently low temperature to harden or solidify and adhere or bond to the surface of the heat dissipating device. The bond may be a permanent bond and may be an intermetallic bond or an intermolecular bond.

The vacuum furnace may be cooled or allowed to cool to a desired temperature, and the inert atmosphere substantially removed from the vacuum furnace to allow removal of heat dissipating device having the TIM layer thereon. The heat dissipating device with the attached TIM layer may then be handled, stored, and/or transported, for example, until it is to be attached to a semiconductor die or other electronic assembly component.

Figure 1:
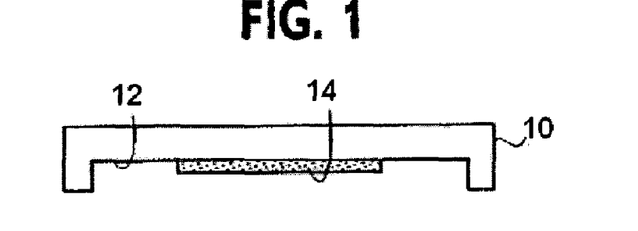
FIG. 1 is a cross-sectional side view of a heat dissipating device according to an example embodiment of the present invention.
Figure 2:
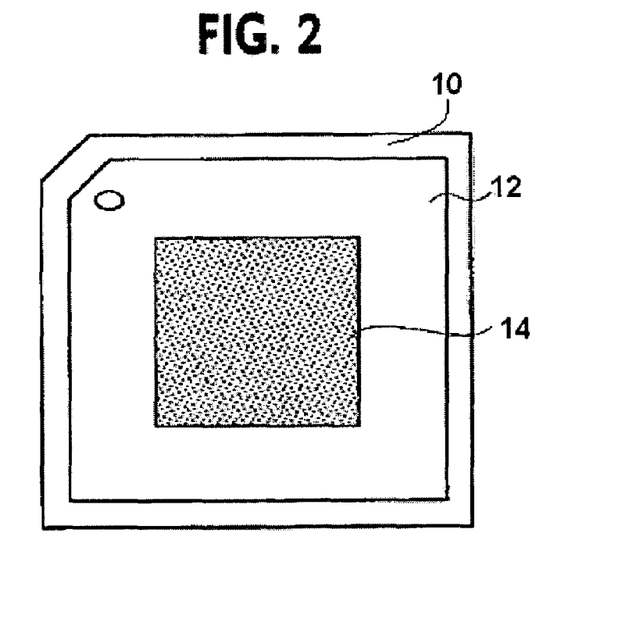
FIG. 2 is a bottom view of the heat dissipating device shown in FIG. 1.
Figure 5:
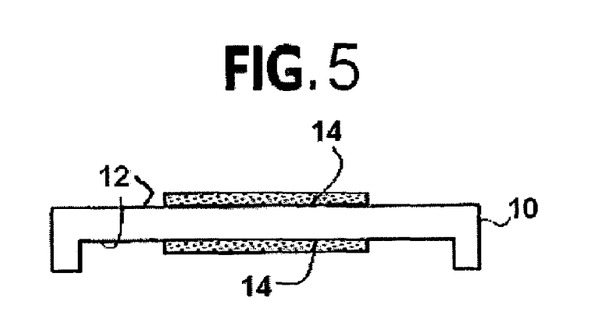
FIG. 5 is a cross-sectional side view of a heat dissipating device according to an example embodiment of the present invention.
Figure 6:
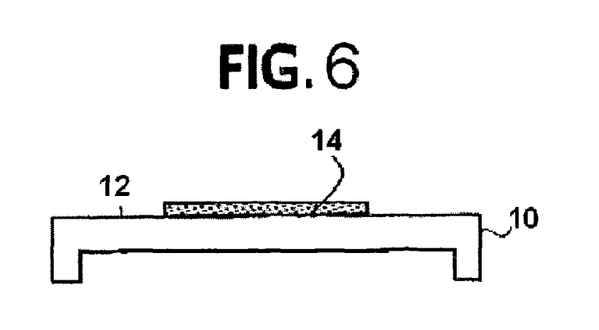
FIG. 6 is a cross-sectional side view of a heat dissipating device according to an example embodiment of the present invention.

FIGS. 1-9 each show a heat dissipating device having a TIM layer thereon according to various embodiments of the present invention. Other arrangements are also possible. More specifically, FIGS. 1 and 6 are side views of an IHS 10 having a bonding surface 12 thereon, to which a TIM layer 14 is attached. FIG. 2 is a bottom view of the IHS of FIG. 1. TIM layers 14 may also be attached to or provided on other bonding surfaces 12 of the IHS 10 as desired, for example, the opposing upper surface of the IHS, 14 as shown in FIG. 5. The second TIM layer may thermally couple another assembly component, such as a heat sink 24, to the heat spreader 10, as shown, for example, in FIG. 9. The TIM layer 14 may be bonded to the bonding surfaces of either the IHS 10 or the heat sink 24. Although not specifically shown in FIG. 9, the TIM layer 14 between the heat sink 24 and the IHS 10 may be bonded to the heat sink 24, to thermally couple the heat sink 24 by an impermanent attachment to the IHS 10.

Figure 9:
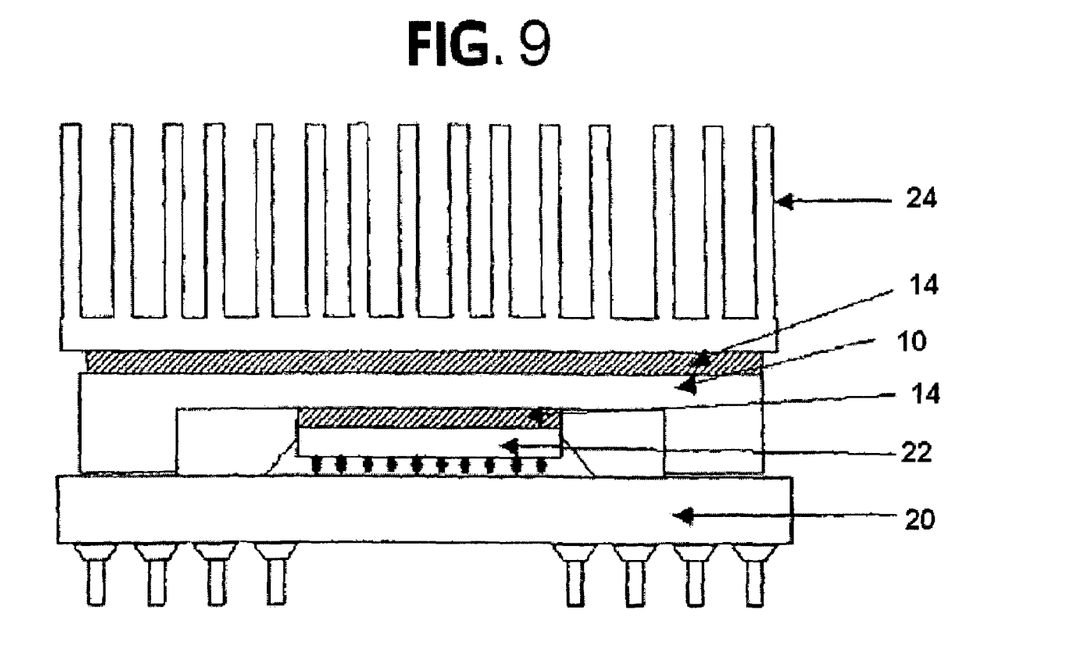
FIG. 9 is a cross-sectional side view of a package assembly according to an example embodiment of the present invention.

The heat dissipating device may be used in connection with a device, such as an electronic device, that generates unwanted heat during operation. As an example, in an integrated semiconductor package assembly shown schematically in FIGS. 8 and 9, a semiconductor die 22, which may generate heat during operation, may rest directly or indirectly on a substrate 20, and the heat spreader 10 may fit as a lid over the top of the semiconductor die 22. The TIM layer 14 may fill a gap between the heat spreader 10 and the semiconductor die 22. As shown in FIG. 9, the integrated semiconductor package assembly may further include a heat sink/fan 24.

Although much of the description herein is directed to a heat spreader and TIM that are used with a semiconductor die, it is to be understood that embodiments of the present invention may apply broadly to any heat dissipating device that contacts, by way of a thermal interface material, any solid surface or device from which one may want to dissipate heat. Thus, embodiments of the present invention are not limited to integrated heat sinks and heat pipes, but may also apply to other heat dissipation devices, such as heat spreaders. Moreover, embodiments of the present invention may also apply to heat dissipation devices designed to be indirectly connected to a heat-generating device.

According to an embodiment of the present invention, an electronic assembly may include a component that is heated to a temperature above ambient temperature by operating the electronic assembly, a heat dissipating member having a bonding surface, wherein the heat dissipating member is spaced from the component, and a thermal interface material including a metallic solder, wherein the thermal interface material is bonded to the bonding surface without a solder flux, and wherein the thermal interface material layer is to thermally couple and/or secure the heat dissipating member and the assembly component.

Embodiments of the present invention may improve thermal conductivity which enables improved thermal metrology measurement resolution by allowing an increase in the power applied to a thermal test vehicle by an amount of about 10% compared to using other TIM layers and processes of applying the same. Time and costs associated with cleanup of residual TIM on the test units and trays, etc. after each test run may be eliminated or reduced. Reapplication of the TIM layer may be obviated. Detaching of the heat dissipating device may also be achieved without dislodging the test vehicles from their sockets. One or more of the above features may reduce the cost associated with and improve the results of performance testing of electronic assemblies.

Additionally, embodiments of the present invention may be provided within one or more component packages, such as integrated circuit packages, which may be physically and electrically coupled to a printed circuit board to form an electrical assembly. The term electrical assembly may be part of an electronic system. An electronic system may be any product including an electronic assembly. Examples of electronic systems include computers (e.g., desktop, laptop, hand-held, server, etc.), wireless communications devices (e.g., cellular phone, cordless phones, pagers, etc.), computer-related peripherals (e.g., printers, scanners, monitors, etc.), entertainment devices (e.g. televisions, radios, stereos, tap and compact disc players, video cassette recorders, MP3 (Motion Picture Experts Group, Audio Layer 3) players, etc.), and the like.

Figure 11:
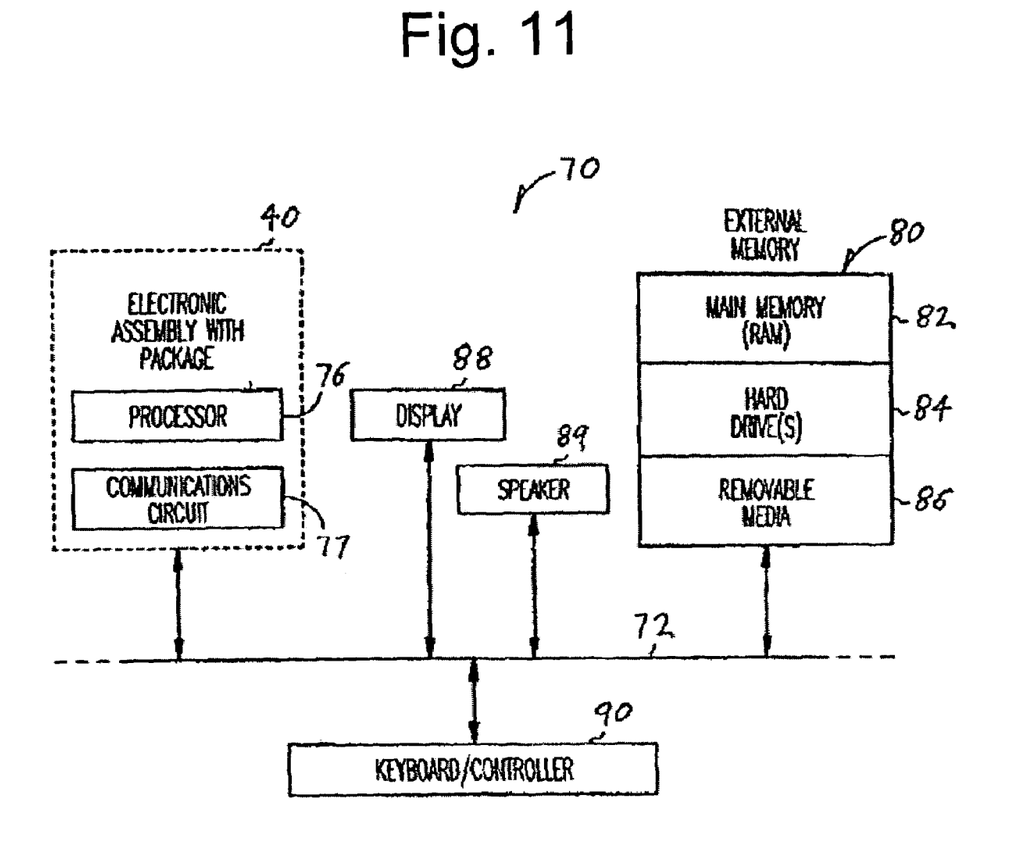
FIG. 11 is a block diagram of an electronic system according to an example embodiment of the present invention.

FIG. 11 is a block diagram of an electronic system 70 incorporating at least one heat dissipating device in an electronic assembly 40, such as a heat dissipating device illustrated in FIGS. 1-9. The electronic system 70 may be a computer system that includes a system bus 72 to electrically couple together the various components of electronic system 70. The system bus 72 may be a single bus or any combination of busses.

The electronic assembly 40 may be coupled to the system bus 72 and may include any circuit, or combination of circuits, for example, a processor 76 which may be of any type. As used herein, processor means any type of circuit such as, but not limited to, a microprocessor, a microcontroller, a graphics processor or a digital signal processor. Other types of circuits that can be included in the electronic assembly 40 are a custom circuit or an application-specific integrated circuit, such as a communications circuit 77 for use in wireless devices such as cellular telephones, pagers, portable computers, two-way radios, and similar electronic systems.

The electronic system 70 may also include an external memory 80 that in turn may include one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs). The electronic system 70 may also include a display device 88, a speaker 89, and a controller 90, such as a keyboard, mouse, trackball, game controller, microphone, voice-recognition device, or any other device that inputs information into the electronic system 70.

As shown herein, the present invention can be implemented in a number of different embodiments, including an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

Additionally, while embodiments have been described with respect to integrated circuits mounted on an integrated substrate, embodiments of the present invention are not limited only to such applications, as they may be used for other types of electronic packages and other types of components, such as passive components, hybrid modules, printed circuit boards, mezzanine boards, and for any other type of electrical structure requiring heat dissipation.

Any reference in the specification to "one embodiment," "an embodiment," "example embodiment," etc., means that a particular feature, structure, or characteristic described in connection with the embodiment is included in at least one embodiment of the invention. The recitation of such phrases in various places in the specification does not necessarily refer to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments of the present invention have been described with reference to a number of illustrative embodiments thereof, it should be understood that numerous other modifications and embodiments may be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
   preparing a bonding surface of a heat dissipating member by removing an oxidation layer from the bonding surface and plating the bonding surface with at least one wetting layer; and
   bonding a metallic solder thermal interface material to the bonding surface, the thermal interface material to thermally couple the heat dissipating member to a heat conducting component by an impermanent attachment, the thermal interface material having a melting point of 200° C. or less and having a phase change temperature within a range of operating temperatures of a thermally coupled component, the metallic solder thermal interface material comprising indium or an alloy thereof, the bonding including:
   providing a solid piece of the thermal interface material in a vacuum chamber under vacuum conditions,
   heating the thermal interface material to a temperature below an oxidation temperature of metal in the vacuum and providing a pressurized inert atmosphere in the vacuum chamber to form liquid metallic solder such that gravity reflows the liquid metallic solder over the bonding surface, the pressurized inert atmosphere being from about 15 to about 40 pounds per square inch (p.s.i.), and
   applying a force to the heat dissipating member to compress the heat dissipating member against the thermal interface material.

2. The method of claim 1, wherein the bonding of the thermal interface material is achieved without using a solder flux.

3. The method of claim 1, wherein the bonding of the thermal interface material comprises forming an intermetallic bond.

4. The method of claim 1, wherein the at least one wetting layer comprises one of gold (Au) and nickel (Ni).

5. The method of claim 1, wherein the heat dissipating member comprises one of copper (Cu) and aluminum (Al).

6. The method of claim 1, wherein the bonding comprises:
reflowing the metallic solder on at least a portion of the bonding surface to form a liquid metallic solder layer; and
allowing the liquid metallic solder layer to cool to a temperature of less than the melting point of the metallic solder.

7. The method of claim 1, wherein the bonding comprises:
placing the metallic solder and the heat dissipating member into the vacuum chamber:
placing the vacuum chamber under vacuum conditions;
heating the metallic solder to a temperature of greater than or equal to the melting point of the metallic solder to form the liquid metallic solder; and
disposing the liquid metallic solder on at least a portion of the bonding surface to form a liquid metallic solder layer.

8. The method of claim 7, wherein the bonding further comprises providing a first inert environment in the vacuum chamber after placing the vacuum chamber under vacuum conditions.

9. The method of claim 8, wherein providing the pressurized inert atmosphere in the vacuum chamber after providing a first inert environment in the vacuum chamber.

10. The method of claim 9, wherein the bonding further comprises:
allowing the liquid metallic solder layer to cool to a temperature of less than the melting point of the metallic solder; and
removing at least a portion of the second pressure environment from the vacuum chamber.

11. A method comprising:
removing an oxidation layer from a bonding surface of a heat dissipating member;
placing a metallic solder and the heat dissipating member into a vacuum chamber, the metallic solder comprising indium or an alloy thereof;
placing the vacuum chamber under vacuum conditions by removing oxygen gas from the vacuum chamber to inhibit oxidation;
heating the metallic solder to a temperature of greater than or equal to the melting point of the metallic solder to form a liquid metallic solder, the heated temperature being about 10° C. to about 300° C.;
after heating the metallic solder, purging the vacuum chamber of oxygen gas and providing a pressurized inert atmosphere in the vacuum chamber, the pressurized inert atmosphere having a pressure of from about 0 to 100 pounds per square inch (p.s.i.):
providing the liquid metallic solder on at least a portion of the bonding surface to form a liquid metallic solder layer;
removing at least a portion of the pressurized inert atmosphere from the vacuum chamber;
allowing the liquid metallic solder layer to cool to a temperature of less than the melting point of the metallic solder; and
applying a force to the heat dissipating member to compress the heat dissipating member against the metallic solder.

12. The method of claim 11, wherein the metallic solder comprises a fluxless metallic solder.

13. The method of claim 11, further comprising providing a wetting layer including one of a gold (Au) plating and a nickel (Ni) plating on the bonding surface prior to placing the heat dissipating member into the vacuum chamber.

14. A method comprising:
removing an oxidation layer from a bonding surface of a heat dissipating device;
providing a solid piece of metallic solder in a vacuum chamber under vacuum conditions by at least removing oxygen gas from the vacuum chamber to inhibit oxidation, the metallic solder comprising indium or an alloy thereof;
heating the solid piece of the metallic solder to at least a melting temperature of the metallic solder while in the vacuum chamber;
after heating the metallic solder, providing a pressurized inert atmosphere in the vacuum chamber while the metallic solder is in the vacuum chamber, the pressurized inert atmosphere having a pressure from about 0 to 100 pounds per square inch (p.s.i.):
bonding the heated metallic solder onto the bonding surface without using a solder flux while the metallic solder is in the vacuum chamber;
allowing the heated metallic solder to cool to a temperature less than the melting point of the metallic solder; and
applying a force to the heat dissipating device to compress the heat dissipating device and the metallic solder.

15. The method of claim 14, wherein the inert atmosphere comprises a nitrogen atmosphere or an argon atmosphere.

16. The method of claim 14, further comprising removing at least a portion of the inert atmosphere from the vacuum chamber.

17. The method of claim 1, wherein the bonding includes providing an inert environment in the vacuum chamber prior to heating the thermal interface material.

18. The method of claim 17, wherein the bonding further includes providing a pressurized environment in the vacuum chamber after providing the inert environment.

19. The method of claim 18, wherein the bonding further includes providing the liquid metallic solder on the bonding surface.

20. The method of claim 19, wherein the bonding further includes removing at least a portion of the inert atmosphere from the vacuum chamber.

21. The method of claim 20, wherein the bonding further includes allowing the liquid metallic solder layer to cool.

22. The method of claim 11, wherein the placing the vacuum chamber under vacuum conditions includes removing a portion of an initial atmosphere from the vacuum chamber.

23. The method of claim 14, wherein the oxidation layer is removed by chemically or mechanically cleaning the bonding surface.

24. The method of claim 1, wherein the oxidation layer is removed by chemically or mechanically cleaning the bonding surface.

25. The method of claim 11, wherein the oxidation layer is removed by chemically or mechanically cleaning the bonding surface.

* * * * *